United States Patent
Liao et al.

(10) Patent No.: US 10,937,713 B2
(45) Date of Patent: Mar. 2, 2021

(54) CHIP ON FILM PACKAGE

(71) Applicant: Novatek Microelectronics Corp., Hsinchu (TW)

(72) Inventors: Chun-Yu Liao, Kaohsiung (TW); Teng-Jui Yu, Taoyuan (TW); Jr-Ching Lin, Hsinchu (TW)

(73) Assignee: Novatek Microelectronics Corp., Hsinchu (TW)

( * ) Notice: Subject to any disclaimer, the term of this patent is extended or adjusted under 35 U.S.C. 154(b) by 0 days.

(21) Appl. No.: 16/005,710

(22) Filed: Jun. 12, 2018

(65) Prior Publication Data

US 2019/0378777 A1    Dec. 12, 2019

(51) Int. Cl.
*H01L 23/50* (2006.01)
*H01L 23/367* (2006.01)
*H01L 23/495* (2006.01)
*H01L 23/498* (2006.01)
*H01L 23/00* (2006.01)

(52) U.S. Cl.
CPC ........ *H01L 23/367* (2013.01); *H01L 23/4985* (2013.01); *H01L 23/49568* (2013.01); *H01L 23/49838* (2013.01); *H01L 23/50* (2013.01); *H01L 24/17* (2013.01)

(58) Field of Classification Search
CPC ............. H01L 23/3736; H01L 23/3735; H01L 51/0097; H01L 23/367; H01L 23/49568; H01L 23/50; H01L 23/4985; H01L 24/17; H01L 23/49838
See application file for complete search history.

(56) References Cited

U.S. PATENT DOCUMENTS

| | | | |
|---|---|---|---|
| 7,561,436 B2* | 7/2009 | Brandenburg | H01L 23/36 257/712 |
| 8,963,195 B2* | 2/2015 | Brooks | H01L 33/644 257/99 |
| 9,400,310 B2* | 7/2016 | Cheng | G01R 31/2884 |
| 9,952,280 B2* | 4/2018 | Cheng | G01R 31/2884 |
| 2004/0145052 A1* | 7/2004 | Ueno | G02F 1/13452 257/734 |
| 2005/0040521 A1* | 2/2005 | Lawlyes | H01L 21/563 257/720 |

(Continued)

FOREIGN PATENT DOCUMENTS

| | | |
|---|---|---|
| CN | 1731917 | 2/2006 |
| CN | 105333407 | 2/2016 |
| CN | 205082059 | 3/2016 |

OTHER PUBLICATIONS

"Office Action of China Counterpart Application", dated Sep. 2, 2020, p. 1-p. 10.

*Primary Examiner* — Nicholas J Tobergte
(74) *Attorney, Agent, or Firm* — JCIPRNET

(57) ABSTRACT

A chip on film package is disclosed, including a flexible film, a patterned circuit layer, a chip, and a dummy metal layer. The flexible film includes a first surface and a second surface opposite to the first surface. The patterned circuit layer is disposed on the first surface. The chip is mounted on the first surface and electrically connected to the patterned circuit layer. The dummy metal layer covers the second surface capable of dissipating heat of the chip. The dummy metal layer is electrically insulated from the patterned circuit layer.

30 Claims, 5 Drawing Sheets

(56) References Cited

U.S. PATENT DOCUMENTS

| | | | |
|---|---|---|---|
| 2005/0077614 A1* | 4/2005 | Chengalva | H01L 25/0655 257/706 |
| 2006/0197181 A1* | 9/2006 | Noguchi | H01L 25/0657 257/530 |
| 2008/0079134 A1* | 4/2008 | Lin | H01L 24/10 257/690 |
| 2009/0166070 A1* | 7/2009 | Lee | H05K 1/0269 174/260 |
| 2012/0273928 A1* | 11/2012 | Kim | H01L 23/4985 257/668 |
| 2016/0007440 A1 | 1/2016 | Lee et al. | |
| 2017/0365547 A1* | 12/2017 | Nakamura | H01L 23/49811 |

\* cited by examiner

CHIP ON FILM PACKAGE

BACKGROUND

Technical Field

The present disclosure generally relates to a chip package. More particularly, the present disclosure relates to a chip on film package.

Description of Related Art

In electronic industry of nowadays, a flip chip with high efficiency is mounted on a flexible substrate to package the chip on film. The chip-on-film package structure can be applied to the electronic product with small size and light weight, such as integrated circuit (IC) chip. However, when the electronic product is working, the chip will generate heat and the heat cannot be always dissipated effectively. Furthermore, when the chip is being packaged and used, the chip may be damaged since the flexible substrate may be bended due to bad strength of the package structure. Then, the life of the electronic product will be shortened.

In the aforementioned chip-on-film package structure, the chip is mounted on the film substrate by flip-chip bonding. However, the flipped chip will generate heat during operation, and the heat can only be dissipated by the back surface of the chip. Furthermore, whenever the strength of the film substrate is not enough to support the chip thereon, the chip may be damaged as being packaged or used.

SUMMARY

Accordingly, the present disclosure is directed to a chip on film package with superior heat dissipation efficiency.

The present disclosure provides a chip on film package including a flexible film, a patterned circuit layer, a chip, and a dummy metal layer. The flexible film includes a first surface and a second surface opposite to the first surface. The patterned circuit layer is disposed on the first surface. The chip is mounted on the first surface and electrically connected to the patterned circuit layer. The dummy metal layer covers the second surface capable of dissipating heat of the chip. The dummy metal layer is electrically insulated from the patterned circuit layer.

The present disclosure further provides a chip on film package including a flexible film, a first patterned circuit layer, a second patterned circuit layer, a chip, and a dummy metal layer. The flexible film includes a first surface and a second surface opposite to the first surface. The first patterned circuit layer is disposed on the first surface. The second patterned circuit layer is disposed on the second surface. The chip is mounted on the first surface and electrically connected to the patterned circuit layer. The metal layer covers the second surface capable of dissipating heat of the chip.

The present disclosure further provides a chip on film package including a flexible film, a patterned circuit layer, a chip, and a continuous metal layer. The flexible film includes a first surface and a second surface opposite to the first surface. The patterned circuit layer is disposed on the first surface. The chip is mounted on the first surface and electrically connected to the patterned circuit layer. The continuous metal layer covers the second surface capable of dissipating heat of the chip and has a non-patterned structure.

The present disclosure further provides a chip on film package including a flexible film, a patterned circuit layer, a chip, and a non-circuit metal layer. The flexible film includes a first surface and a second surface opposite to the first surface. The patterned circuit layer is disposed on the first surface. The chip is mounted on the first surface and electrically connected to the patterned circuit layer. The non-circuit metal layer covers the second surface capable of dissipating heat of the chip.

In light of the foregoing, the dummy metal layer of the chip on film package covers the back surface (e.g. the second surface) of the flexible film. The dummy metal layer is electrically insulated from the patterned circuit layer on the top surface (e.g. the first surface) of the flexible film. Accordingly, with the great area of metal layer covering the back surface of the flexible film, the heat generated from the chip can be dissipated efficiently by the dummy metal layer, such that the heat dissipation efficiency of the chip on film package can be improved.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
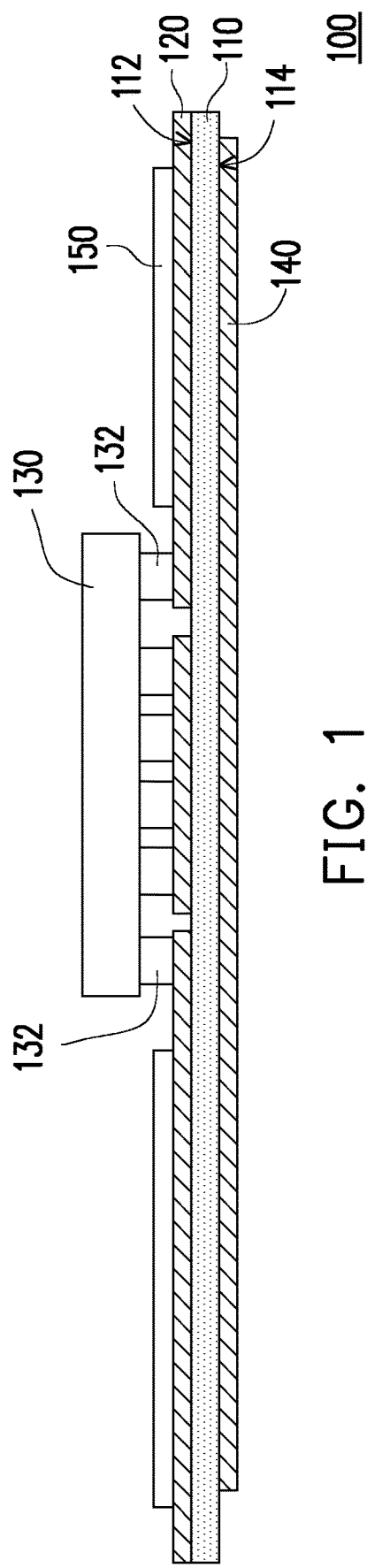
FIG. 1 illustrates a cross sectional view of a chip on film package according to an embodiment of the disclosure.

Reference will now be made in detail to the present preferred embodiments of the disclosure, examples of which are illustrated in the accompanying drawings. Wherever possible, the same reference numbers are used in the drawings and the description to refer to the same or like parts.

In some embodiments, a chip on film package is disclosed. The chip on film package can include a flexible film which includes a first surface and a second surface opposite to the first surface, a patterned circuit layer disposed on the first surface, and a chip mounted on the first surface and electrically connected to the patterned circuit layer. The chip on film package can further include a dummy metal layer covering the second surface capable of dissipating heat of the chip, wherein the dummy metal layer is electrically insulated from the patterned circuit layer. With the metal layer covering the second surface of the flexible film, the heat generated from the chip can be dissipated efficiently by the dummy metal layer, such that the heat dissipation efficiency of the chip on film package can be improved.

In the same or alternative embodiments, the chip on film package can include a second patterned circuit layer disposed on the second surface. The chip mounted on the first surface and electrically connected to the first patterned circuit layer. The dummy metal layer covering the second surface is capable of (or mainly disposed for) dissipating heat of the chip. The second patterned circuit layer may be electrically coupled to either or both of the first patterned circuit layer and the chip. Preferably but not necessarily, the dummy metal layer is electrically insulated from the first patterned circuit layer. Preferably but not necessarily, the dummy metal layer is electrically insulated from the second patterned circuit layer.

In some embodiments, a chip on film package is disclosed. The chip on film package can include a flexible film including a first surface and a second surface opposite to the first surface, a patterned circuit layer disposed on the first surface, a chip mounted on the first surface and electrically connected to the patterned circuit layer. In addition, the chip on film package can further include a continuous metal layer covering the second surface. The continuous metal layer is capable of (or mainly disposed for) dissipating heat of the chip and having a non-patterned structure. Preferably but not necessarily, the continuous metal layer has an area greater than an area of the chip for better heat dissipation.

In some embodiments, a chip on film package is disclosed. The chip on film package can include a flexible film which can include a first surface and a second surface opposite to the first surface, a patterned circuit layer disposed on the first surface, a chip mounted on the first surface and electrically connected to the patterned circuit layer. The chip on film package can further include a non-circuit metal layer covering the second surface capable of (or mainly disposed for) dissipating heat of the chip. Preferably but not necessarily, the non-circuit metal layer is a continuous metal layer or non-patterned metal layer.

Figure 2:
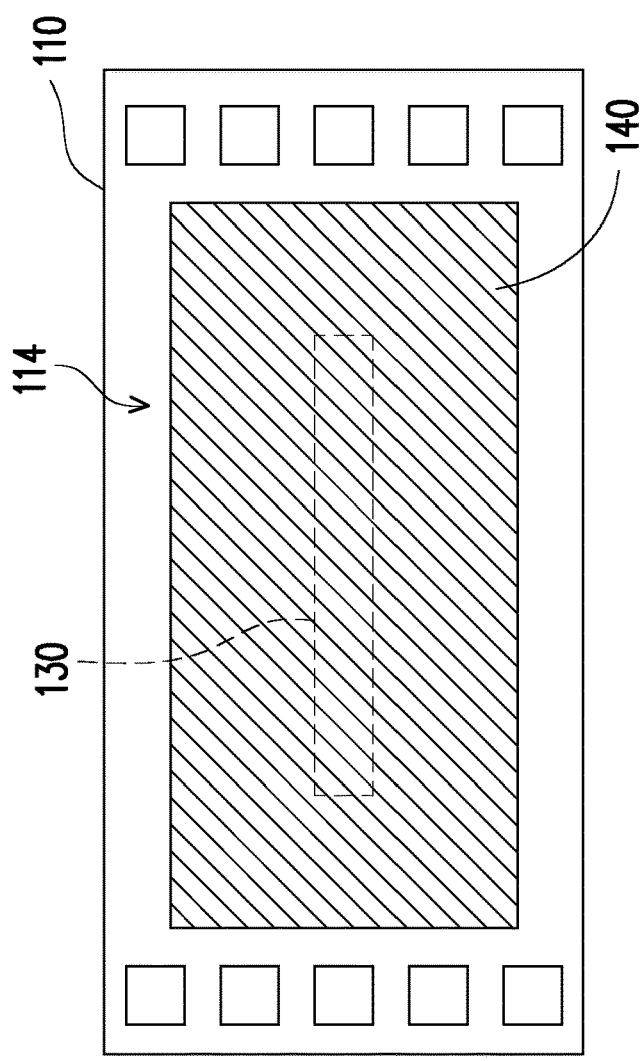
FIG. 2 illustrates a bottom view of a chip on film package according to an embodiment of the disclosure.

FIG. 1 illustrates a cross sectional view of a chip on film package according to an embodiment of the disclosure. FIG. 2 illustrates a bottom view of a chip on film package according to an embodiment of the disclosure. Referring to FIG. 1 and FIG. 2, in some embodiments, a chip on film package 100 includes a flexible film 110, a patterned circuit layer 120, a chip 130 and a dummy metal layer 140. The flexible film 110 includes a first surface 112 and a second surface 114 opposite to the first surface 112, and the patterned circuit layer 120 is formed on the first surface 112. The flexible film 110 may be made of a resin such as polyimide, polyester, or the like. The chip 130 is mounted on the first surface 112 of the flexible film 110 and has an active surface. A plurality of bumps 132 (and/or the dummy bumps 134 shown in FIG. 4) are formed on the active surface of the chip 130 and electrically connected to the patterned circuit layer 120 of the flexible film 110. The patterned circuit layer 120 can be served as non-floating circuits. A sealant may be coated between the chip 130 and the flexible film 110, wherein the sealant can be one selected from the group consisting of an under-filling material, a resin, an anisotropic conductive paste (ACP) and an anisotropic conductive film (ACF), etc.

The patterned circuit layer 120 is disposed on the first surface 112. The chip 130 is mounted on the first surface 112 and electrically connected to the patterned circuit layer 120. In some embodiments, the chip on film package 100 may further include a solder resist layer 150. The solder resist layer 150 is disposed on the patterned circuit layer 120 and exposes a part of the patterned circuit layer 120 where the chip 130 is mounted.

The dummy metal layer 140 covers the second surface 114 capable of dissipating heat of the chip 130. The dummy metal layer 140 is electrically insulated from the patterned circuit layer 120 and is capable of dissipating heat of the chip 130.

In some embodiments, the dummy metal layer 140 has a floating voltage. In other words, the dummy metal layer 140 is not electrically connected to another non-floating conductor or node. Without such a connection, voltages and current flows are induced by electromagnetic fields or charge accumulation within the conductor rather than being due to the usual external potential difference of a power source.

In some other embodiments, the dummy metal layer 140 is electrically connected to a reference voltage. In other words, the dummy metal layer 140 is electrically connected to a fixed (constant) voltage irrespective of the loading on the chip 130, power supply variations, temperature changes, and the passage of time. In one of the implementations, the reference voltage is a ground voltage. Namely, the dummy metal layer 140 is grounded.

Preferably but not necessarily, the dummy metal layer 140 is a continuous metal layer covering the second surface 114 as it is shown in FIG. 2. In other words, the dummy metal layer 140 has a non-patterned structure. Namely, the dummy metal layer 140 is a non-patterned metal layer. The dummy metal layer 140 can be patterned or even separated in some implementations. In addition, the dummy metal layer 140 (e.g. continuous metal layer) preferably (but not necessarily) has an area greater than an area of the chip 130 as it is shown in FIG. 2. In some embodiments, a material of the dummy metal layer 140 includes copper, and the dummy metal layer 140 can be formed by electroplating process without any patterning process such as additive process, semi-additive process, subtractive process, etc. In some embodiments, the dummy metal layer 140 is a non-circuit metal layer covering the second surface 114 and capable of dissipating heat of the chip 130. It is noted that the additional metal layer can mean a non-circuit metal layer configured for or capable of dissipating heat of the chip, thus functioning differently from circuit metal layers configured for implementing circuits having specific functions such as amplification, computation, and data transfer. With such a configuration, the dummy metal layer 140 covering the second surface 114 of the flexible film 110 with great area of metal facilitates the heat dissipation of the chip 130.

Figure 3:
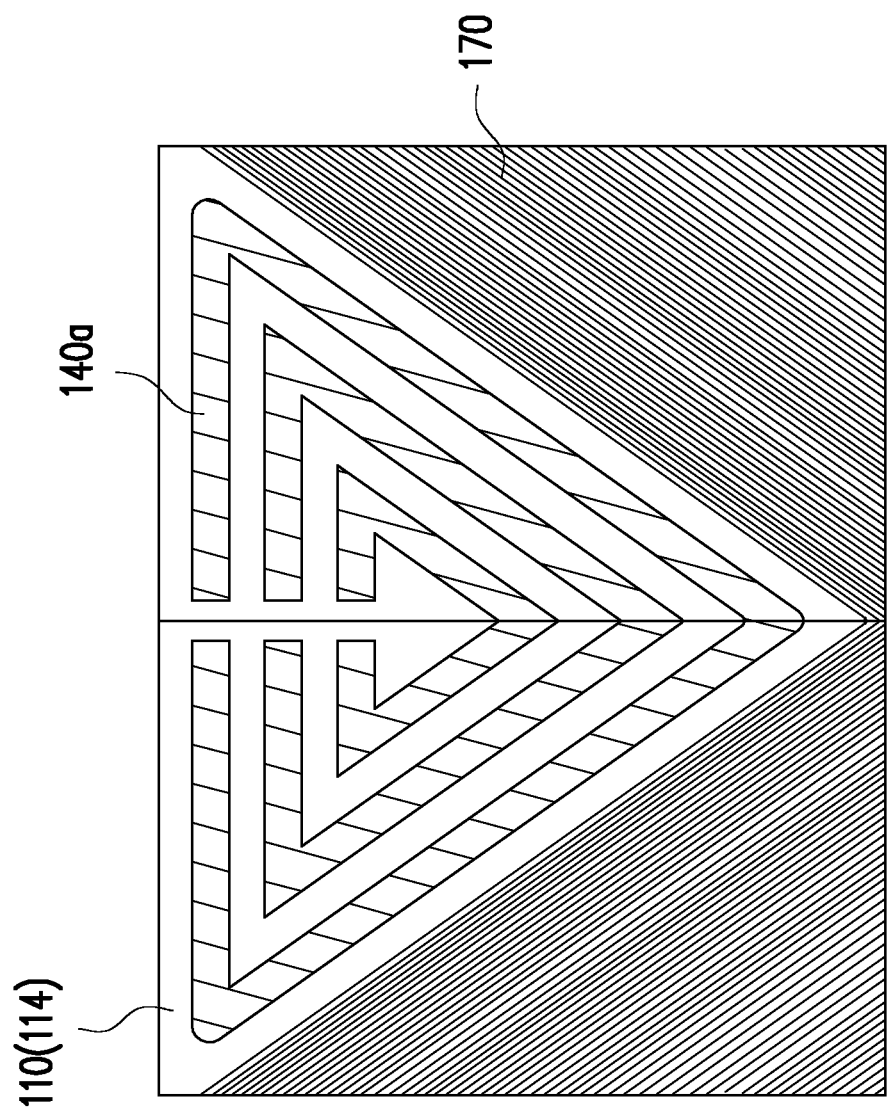
FIG. 3 illustrates a partially enlarged view of a dummy metal layer of a chip on film package according to an embodiment of the disclosure.

FIG. 3 illustrates a partially enlarged view of a dummy metal layer of a chip on film package according to an embodiment of the disclosure. It is noted that the dummy metal layer of the chip on film package shown in FIG. 3 contains many features same as or similar to the chip on film package 100 disclosed earlier with FIG. 1 and FIG. 2. For purpose of clarity and simplicity, detail description of same or similar features may be omitted, and the same or similar reference numbers denote the same or like components. The main differences between the embodiment of FIG. 3 and the embodiment of FIG. 1 and FIG. 2 are described as follows.

Referring to FIG. 3, in some embodiments, the dummy metal layer 140a may be a patterned metal layer as it is shown in FIG. 3. In detail, the dummy metal layer 140a is a non-circuit patterned metal layer and can be formed by an electroplating process and a patterning process such as additive process, semi-additive process, subtractive process, etc. In one of the implementation, the patterned circuit layer 120 disposed on the first surface 112 of the flexible film 110 is the first patterned circuit layer.

In addition, the chip on film package in FIG. 3 may further include a second patterned circuit layer 170 disposed on the second surface 114 of the flexible film 110. The second patterned circuit layer 170 can be configured to facilitate the heat dissipation of the chip 130. The second patterned circuit layer 170 can also serve as non-floating circuits of the chip on film package, which may or may not be electrically connected to the first patterned circuit layer 120. The dummy metal layer 140a can cover at least a part of the rest of the second surface 114 not covered by the second patterned circuit layer 170. In some embodiments, the dummy metal layer 140a is electrically insulated from the first patterned circuit layer 120 and the second patterned circuit layer 170 to facilitate the heat dissipation of the chip 130. In addition, since the dummy metal layer 140a fills the area not covered by the second patterned circuit layer 170 on the second surface 114, the stress distribution on the second surface can be more evenly and uniformly. In the embodiment of the second patterned circuit layer 170 and the dummy metal layer 140a disposed on the second surface 114, the dummy metal layer may also be a continuous metal layer having a non-patterned structure, which can cover at least a part of the rest of the second surface 114 not covered by the second patterned circuit layer 170.

Figure 4:
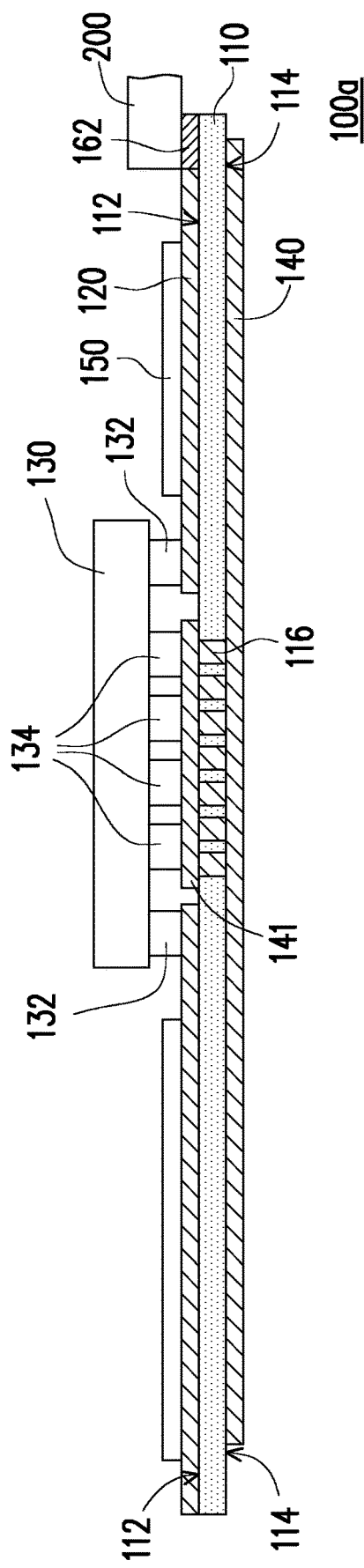
FIG. 4 illustrates a cross sectional view of a chip on film package according to an embodiment of the disclosure.

FIG. 4 illustrates a cross sectional view of a chip on film package according to an embodiment of the disclosure. It is noted that the chip on film package 100a shown in FIG. 4 contains many features same as or similar to the chip on film package 100 disclosed earlier with FIG. 1 and FIG. 2. For purpose of clarity and simplicity, detail description of same or similar features may be omitted, and the same or similar reference numbers denote the same or like components. The main differences between the chip on film package 100a shown in FIG. 4 and the chip on film package 100 shown in FIG. 1 and FIG. 2 are described as follows.

Referring to FIG. 4, in some embodiments, the chip 130 includes one or more signal bumps 132 and one or more dummy bumps 134. The signal bumps 132 are electrically connected to the patterned circuit layer 120 for, for example, signal transmitting purpose. The dummy bumps 134 can be thermally coupled to the chip 130 and can be electrically insulated from either or both of the signal bumps 132 and the patterned circuit layer 120. In some embodiments, the flexible film 110 further includes one or more vias 116 electrically connecting the dummy metal layer 140 and the dummy bumps 134. In some embodiments, the chip on film package 100a may further include an extra dummy metal layer 141 disposed on the first surface 112. As such, the dummy bumps 134 are connected to the extra dummy metal layer 141, and the extra dummy metal layer 141 is electrically insulated from the patterned circuit layer 120. Accordingly, the vias 116 are electrically connected to the dummy bumps 134 through the extra dummy metal layer 141 on the first surface 112.

With such an arrangement, the heat generated by the chip 130 can be conducted to the dummy metal layer 140 through the heat conducting path formed of the dummy bumps 134, the extra dummy metal layer 141, and the vias 116, and the heat can be dissipated to external environment via the dummy metal layer 140 on the second surface 114. In some embodiments, the patterned circuit layer 120 may further include a plurality of signal pads 162 electrically connected to the patterned circuit layer 120, such that a substrate 200 (e.g. a glass substrate, a printed circuit board, etc.) can be bonded to the chip on film package 100a through the signal pads 162. Preferably but not necessarily, the dummy metal layer 140 can be electrically insulated from the signal pads 162.

Figure 5:
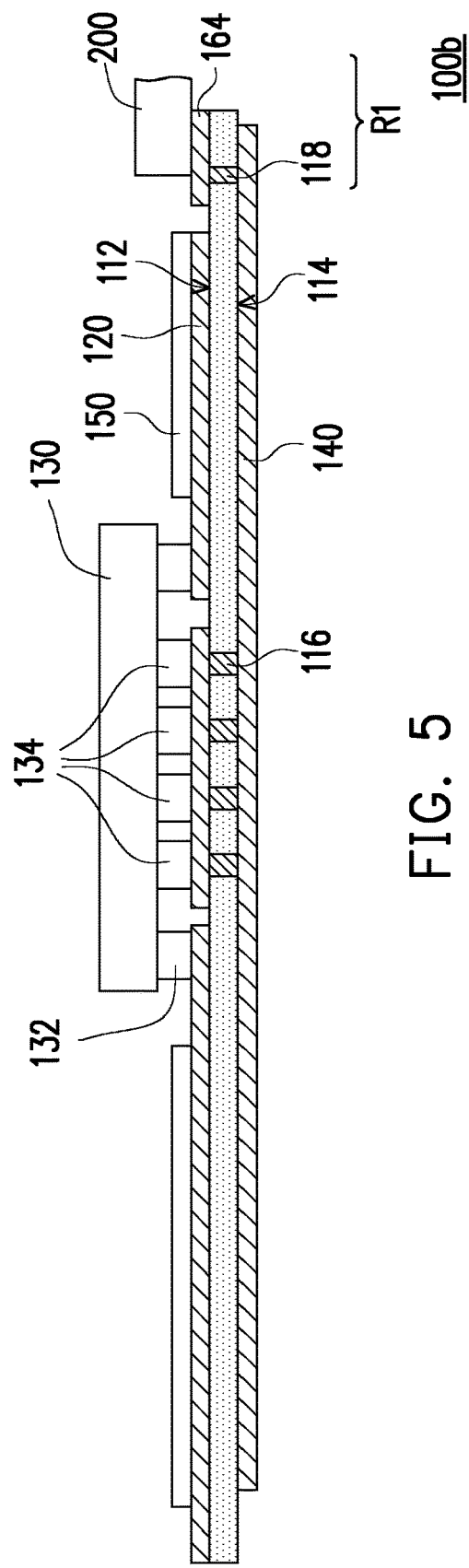
FIG. 5 illustrates a cross sectional view of a chip on film package according to an embodiment of the disclosure.

FIG. 5 illustrates a cross sectional view of a chip on film package according to an embodiment of the disclosure. It is noted that the chip on film package 100b shown in FIG. 5 contains many features same as or similar to the chip on film package 100a disclosed earlier with FIG. 4. For purpose of clarity and simplicity, detail description of same or similar features may be omitted, and the same or similar reference numbers denote the same or like components. The main differences between the chip on film package 100b shown in FIG. 5 and the chip on film package 100a shown in FIG. 4 are described as follows.

Referring to FIG. 5, in some embodiments, the flexible film 110 may further include a bonding region R1 configured to be bonded to a substrate 200. In some embodiments, the substrate 200 may be a glass substrate, a printed circuit board or any other suitable substrate. The bonding region R1 includes a plurality of signal pads (e.g. the signal pad 162 as shown in FIG. 4), which are electrically connected to the patterned circuit layer 120 for transmitting signals between the chip 130 and the substrate 200. The dummy metal layer 140 is electrically insulated from the signal pads 162.

In some embodiments, the chip 130 may further include the dummy bumps 134, which can be thermally coupled to the chip 130 and/or can be electrically insulated from either or both of the signal bumps 132 and the patterned circuit layer 120. In some embodiments, dummy bumps 134 are thermally coupled to the dummy metal layer 140 through the vias 116 to facilitate the heat dissipation of the chip 130. In some embodiments, the bonding region R1 further includes a plurality of dummy pads 164. In addition, the dummy pads 164 can be electrically insulated from either or both of the signal pads 162 and the patterned circuit layer 120, and/or the dummy metal layer 140 can be thermally coupled to the dummy pads 164. In one implementation, the flexible film 110 may further include one or more vias 118 penetrating the flexible film 110. Accordingly, the dummy pads 164 are thermally coupled to the dummy metal layer 140 through the vias 118. With such a configuration, the heat from the chip 130 may be conducted to the dummy metal layer 140 through the heat conducting path formed of the dummy bumps 134, and the vias 116. In addition, the heat from the substrate 200 may also be conducted to the dummy metal layer 140 through the heat conducting path formed of the dummy pads 164, and the vias 118, such that the heat from the chip 130 and the substrate 200 can be dissipated to external environment via the dummy metal layer 140 on the second surface 114.

Figure 6:
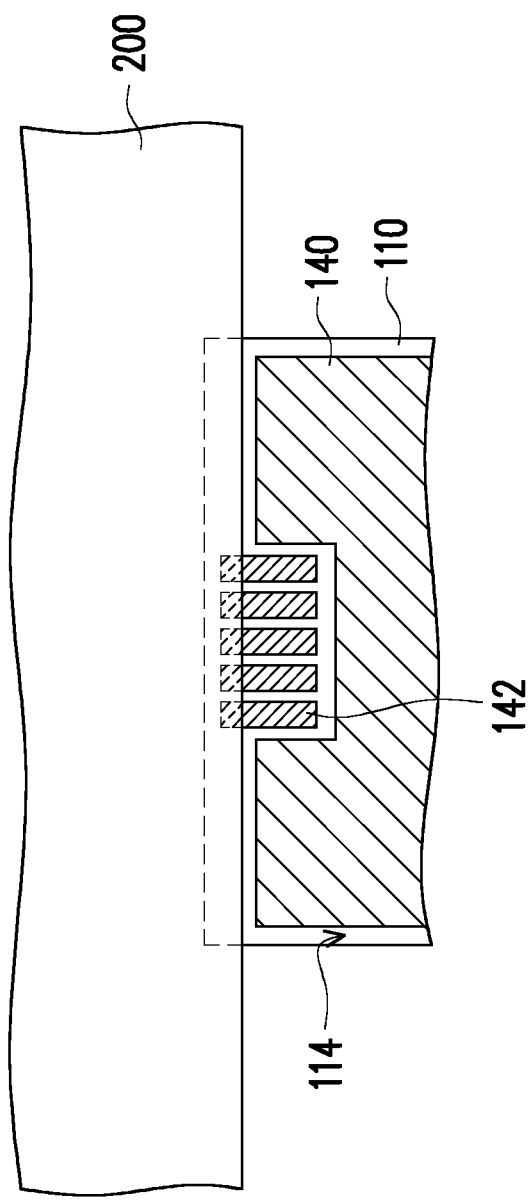
FIG. 6 illustrates a bottom view of a chip on film package according to an embodiment of the disclosure.
Figure 7:
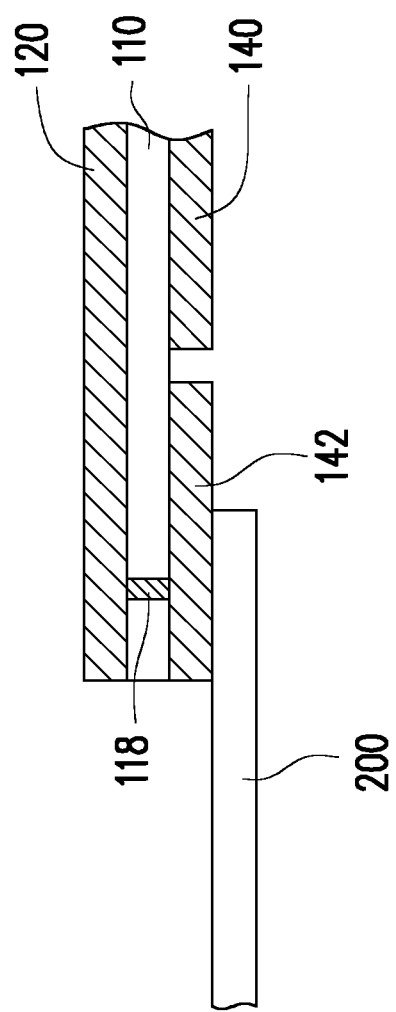
FIG. 7 illustrates a cross sectional view of a chip on film package according to an embodiment of the disclosure.

FIG. 6 illustrates a bottom view of a chip on film package according to an embodiment of the disclosure. FIG. 7 illustrates a cross sectional view of a chip on film package according to an embodiment of the disclosure. It is noted that the chip on film package shown in FIG. 6 and FIG. 7 may contain many features same as or similar to the chip on film package 100a disclosed with FIG. 4. For purpose of clarity and simplicity, detail description of same or similar features is omitted, and the same or similar reference numbers denote the same or like components. The main differences between the chip on film package shown in FIG. 6 and FIG. 7 and the chip on film package 100a shown in FIG. 4 are described as follows.

In some embodiments, referring to FIG. 6 and FIG. 7, the chip on film package may further include a patterned circuit layer 142 disposed on the second surface 114. The patterned circuit layer 142 may function as a plurality of signal pads (similar to the signal pad 162 shown in FIG. 4), and can be electrically connected to the patterned circuit layer 120 through via 118 (not shown). The dummy metal layer 140 can be electrically insulated from the patterned circuit layer 142 as shown in FIG. 7.

Referring to FIG. 5 to FIG. 7, the chip in the present embodiment may be similar to the chip 130 shown in FIG. 5, which may further include the dummy bumps 134. The dummy bumps 134 may be thermally coupled to the chip 130 and/or electrically insulated from the signal bumps 132 and the patterned circuit layer 120. In some embodiments, the dummy bumps 134 are thermally coupled to the dummy metal layer 140 through the vias 116 to facilitate the heat dissipation of the chip 130.

With such configuration, the heat from the chip 130 and the substrate 200 can be dissipated to external environment via the dummy metal layer 140 on the second surface 114 (with or without the help of the dummy bumps 134 and the vias 116). In addition, the substrate 200 may be bonded to the patterned circuit layer 142, which is electrically insulated from the dummy metal layer 140.

In sum, at least one additional metal layer or at least one dummy metal layer of the chip on film package can cover the back surface (e.g. the second surface 114) of the flexible film. The additional or dummy metal layer can be electrically insulated from the patterned circuit layer on the top surface (e.g. the first surface 112) of the flexible film. Accordingly, with the metal layer covering the back surface of the flexible film, the heat generated from the chip can be dissipated efficiently by the additional/dummy metal layer, such that the heat dissipation efficiency of the chip on film package can be improved. It is noted that the additional metal layer can mean a non-circuit metal layer configured for or capable of dissipating heat of the chip, thus functioning differently from circuit metal layers configured for implementing circuits. The non-circuit metal layer can be a continuous metal layer or a non-patterned metal layer. Additionally or alternatively, the additional metal layer can be a continuous metal layer covering the second surface capable of dissipating heat of the chip and having a non-patterned structure. Preferably but not necessarily, the continuous metal layer has an area greater than an area of the chip.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A chip on film package, comprising:
   a flexible film comprising a first surface and a second surface opposite to the first surface;
   a patterned circuit layer disposed on the first surface;
   a chip mounted on the first surface and electrically connected to the patterned circuit layer; and
   a dummy metal layer covering and directly contacting the second surface capable of dissipating heat of the chip, wherein the dummy metal layer is electrically insulated from the patterned circuit layer.

2. The chip on film package as claimed in claim 1, wherein the dummy metal layer has a floating voltage.

3. The chip on film package as claimed in claim 1, wherein the dummy metal layer is connected to a reference voltage.

4. The chip on film package as claimed in claim 3, wherein the reference voltage is a ground voltage.

5. The chip on film package as claimed in claim 1, wherein the chip comprises one or more signal bumps and one or more dummy bumps, the one or more signal bumps are electrically connected to the patterned circuit layer and the one or more dummy bumps are electrically insulated from the patterned circuit layer.

6. The chip on film package as claimed in claim 5, wherein the flexible film further comprises one or more vias electrically connecting the dummy metal layer and the dummy bumps.

7. The chip on film package as claimed in claim 1, further comprising an extra dummy metal layer disposed on the first surface.

8. The chip on film package as claimed in claim 7, wherein the chip comprises one or more signal bumps and one or more dummy bumps, the one or more signal bumps are electrically connected to the patterned circuit layer and the one or more dummy bumps are electrically insulated from the patterned circuit layer and connected to the extra dummy metal layer.

9. The chip on film package as claimed in claim 1, further comprising a solder resist layer disposed on the patterned circuit layer and exposing a part of the patterned circuit layer where the chip is mounted.

10. The chip on film package as claimed in claim 1, wherein the dummy metal layer is a continuous metal layer having a non-patterned structure.

11. The chip on film package as claimed in claim 1, wherein the dummy metal layer is a patterned metal layer.

12. The chip on film package as claimed in claim 1, wherein the flexible film further comprises a bonding region configured to be bonded to a substrate, the bonding region comprises a plurality of signal pads electrically connected to the patterned circuit layer.

13. The chip on film package as claimed in claim 12, wherein the dummy metal layer is electrically insulated from the signal pads.

14. The chip on film package as claimed in claim 12, wherein the substrate comprises a glass substrate or a printed circuit board.

15. The chip on film package as claimed in claim 12, wherein the bonding region comprises a plurality of dummy pads, and the dummy metal layer is electrically connected to the dummy pads.

16. The chip on film package as claimed in claim 12, wherein the flexible film further comprises one or more vias electrically connecting the dummy metal layer and the dummy pads.

17. The chip on film package as claimed in claim 1, wherein the dummy metal layer has an area greater than an area of the chip.

18. The chip on film package as claimed in claim 1, wherein a material of the dummy metal layer comprises copper.

19. A chip on film package, comprising:
    a flexible film comprising a first surface and a second surface opposite to the first surface;
    a first patterned circuit layer disposed on the first surface;
    a second patterned circuit layer disposed on the second surface;
    a chip mounted on the first surface and electrically connected to the first patterned circuit layer; and
    a dummy metal layer covering the second surface capable of dissipating heat of the chip.

20. The chip on film package as claimed in claim 19, wherein the second patterned circuit layer is electrically coupled to either or both of the first patterned circuit layer and the chip.

21. The chip on film package as claimed in claim 19, wherein the dummy metal layer is electrically insulated from the first patterned circuit layer.

22. The chip on film package as claimed in claim 19, wherein the dummy metal layer is electrically insulated from the second patterned circuit layer.

23. A chip on film package, comprising:
   a flexible film comprising a first surface and a second surface opposite to the first surface;
   a patterned circuit layer disposed on the first surface;
   a chip mounted on the first surface and electrically connected to the patterned circuit layer;
   a dummy metal layer covering the second surface capable of dissipating heat of the chip, wherein the dummy metal layer is electrically insulated from the patterned circuit layer; and
   an extra dummy metal layer disposed on the first surface.

24. The chip on film package as claimed in claim 23, wherein the chip comprises one or more signal bumps and one or more dummy bumps, the one or more signal bumps are electrically connected to the patterned circuit layer and the one or more dummy bumps are electrically insulated from the patterned circuit layer and connected to the extra dummy metal layer.

25. A chip on film package, comprising:
   a flexible film comprising a first surface and a second surface opposite to the first surface;
   a patterned circuit layer disposed on the first surface;
   a chip mounted on the first surface and electrically connected to the patterned circuit layer;
   a dummy metal layer covering the second surface capable of dissipating heat of the chip, wherein the dummy metal layer is electrically insulated from the patterned circuit layer; and
   a solder resist layer disposed on the patterned circuit layer and exposing a part of the patterned circuit layer where the chip is mounted.

26. A chip on film package, comprising:
   a flexible film comprising a first surface and a second surface opposite to the first surface, wherein the flexible film further comprises a bonding region configured to be bonded to a substrate, the bonding region comprises a plurality of signal pads;
   a patterned circuit layer disposed on the first surface and electrically connected to the plurality of signal pads;
   a chip mounted on the first surface and electrically connected to the patterned circuit layer; and
   a dummy metal layer covering the second surface capable of dissipating heat of the chip, wherein the dummy metal layer is electrically insulated from the patterned circuit layer.

27. The chip on film package as claimed in claim 26, wherein the dummy metal layer is electrically insulated from the signal pads.

28. The chip on film package as claimed in claim 26, wherein the substrate comprises a glass substrate or a printed circuit board.

29. The chip on film package as claimed in claim 26, wherein the bonding region comprises a plurality of dummy pads, and the dummy metal layer is electrically connected to the dummy pads.

30. The chip on film package as claimed in claim 26, wherein the flexible film further comprises one or more vias electrically connecting the dummy metal layer and the dummy pads.

* * * * *